(12) United States Patent
Holden et al.

(10) Patent No.: US 8,600,534 B2
(45) Date of Patent: Dec. 3, 2013

(54) METHOD OF DESIGNING A STRUCTURE

(75) Inventors: Carren Holden, Bristol (GB); David J J Toal, Bristol (GB); Neil W. Bressloff, Bristol (GB); Andrew J. Keane, Bristol (GB)

(73) Assignee: Airbus Operations Ltd, Bristol (GB)

( * ) Notice: Subject to any disclaimer, the term of this patent is extended or adjusted under 35 U.S.C. 154(b) by 369 days.

(21) Appl. No.: 12/493,458

(22) Filed: Jun. 29, 2009

(65) Prior Publication Data

US 2010/0004769 A1    Jan. 7, 2010

(30) Foreign Application Priority Data

Jul. 1, 2008    (GB) .................................. 0811942.2

(51) Int. Cl.
*G06F 19/00*      (2011.01)

(52) U.S. Cl.
USPC ................................ 700/97; 703/1

(58) Field of Classification Search
USPC ........ 700/28, 97, 98, 117, 182; 703/1, 2, 6, 7, 703/8
See application file for complete search history.

(56) References Cited

U.S. PATENT DOCUMENTS

| | | | |
|---|---|---|---|
| 5,625,762 A * | 4/1997 | Takizawa et al. ............. 345/591 |
| 6,311,309 B1 | 10/2001 | Southgate | |
| 6,341,261 B1 * | 1/2002 | Vasey-Glandon et al. ........ 703/6 |
| 6,606,612 B1 | 8/2003 | Rai et al. | |
| 6,705,838 B1 * | 3/2004 | Bak et al. ...................... 416/243 |
| 6,956,569 B1 * | 10/2005 | Roy et al. ..................... 345/426 |
| 7,010,472 B1 * | 3/2006 | Vasey-Glandon et al. ........ 703/6 |
| 7,023,446 B1 * | 4/2006 | Iwasaki ......................... 345/581 |
| 7,200,453 B2 * | 4/2007 | Knight et al. .................... 700/98 |
| 7,243,056 B2 * | 7/2007 | Olhofer et al. ..................... 703/7 |
| 7,287,240 B2 * | 10/2007 | Toyama et al. .................. 716/52 |
| 7,301,538 B2 * | 11/2007 | Buyanovskiy ................ 345/426 |
| 7,519,522 B2 * | 4/2009 | Smith et al. ........................ 703/8 |
| 7,571,084 B2 * | 8/2009 | Smith et al. ........................ 703/8 |
| 7,583,271 B2 * | 9/2009 | Kawakami et al. ............ 345/582 |
| 7,751,917 B2 * | 7/2010 | Rees et al. ....................... 700/97 |
| 7,831,418 B1 * | 11/2010 | Sendhoff et al. ................... 703/6 |
| 8,006,220 B2 * | 8/2011 | McConaghy et al. ......... 716/132 |
| 2001/0020946 A1 * | 9/2001 | Kawakami et al. ............ 345/582 |
| 2003/0079188 A1 | 4/2003 | McConaghy et al. | |

(Continued)

FOREIGN PATENT DOCUMENTS

| | | |
|---|---|---|
| WO | 2005089191 A2 | 9/2005 |
| WO | 2006046737 A1 | 5/2006 |

OTHER PUBLICATIONS

UK Search Report for GB0811942.2 dated Sep. 29, 2008.

*Primary Examiner* — Charles Kasenge
(74) *Attorney, Agent, or Firm* — Lowe Hauptman & Ham, LLP

(57) ABSTRACT

A method of designing a structure, such as an airfoil section. A first set of candidate designs is generated in a first optimisation process, each candidate design comprising a set of M design variables associated with an M-dimensional design space. A subset of the first set of candidate designs is selected. The selected subset of candidate designs is analysed by proper orthogonal decomposition or principal component analysis to generate an N-dimensional design space defined by N design variables, N being less than M. A second set of one or more candidate designs is then generated in a second optimisation process, each candidate design comprising a set of N design variables associated with the N-dimensional design space.

10 Claims, 5 Drawing Sheets

(56) References Cited

U.S. PATENT DOCUMENTS

| | | |
|---|---|---|
| 2003/0101030 A1* | 5/2003 | Harwood .......................... 703/2 |
| 2004/0243360 A1* | 12/2004 | Niedermeier et al. ............ 703/1 |
| 2004/0267393 A1* | 12/2004 | Knight et al. ................... 700/98 |
| 2005/0131660 A1* | 6/2005 | Yadegar et al. ................... 703/2 |
| 2005/0159936 A1* | 7/2005 | Rees et al. ........................ 703/6 |
| 2005/0240612 A1* | 10/2005 | Holden et al. ............... 707/102 |
| 2006/0012597 A1* | 1/2006 | Chakraborty ................. 345/419 |
| 2006/0038812 A1* | 2/2006 | Warn et al. .................... 345/419 |
| 2006/0058985 A1 | 3/2006 | Arslan et al. |
| 2006/0247902 A1* | 11/2006 | Rourke ............................. 703/1 |
| 2007/0073429 A1* | 3/2007 | Rees et al. ...................... 700/97 |
| 2008/0018643 A1* | 1/2008 | Feilkas et al. ................. 345/420 |
| 2009/0157364 A1* | 6/2009 | Velazquez Lopez et al. ..... 703/8 |
| 2010/0305925 A1* | 12/2010 | Sendhoff et al. .................. 703/8 |

\* cited by examiner

METHOD OF DESIGNING A STRUCTURE

RELATED APPLICATIONS

The present application is based on, and claims priority from, British Application Number 0811942.2, filed Jul. 1, 2008, the disclosure of which is hereby incorporated by reference herein in its entirety.

FIELD OF THE INVENTION

The present invention relates to a method of designing a structure, such as an airfoil section or a wing.

BACKGROUND OF THE INVENTION

Optimization problems in the design of a structure typically involve finding a set of variables which maximize a chosen objective function. Given an optimization problem requiring an expensive simulation, surrogate models are often constructed to model the response of an objective function to changes in the magnitude of the variables. Therefore fewer evaluations of the expensive simulation are required. Traditional surrogate modelling techniques are not typically employed on problems with more than 15-20 variables due to the adverse effect of problem dimensionality given a small available number of simulations. Variable reduction techniques, such as those of:

Welch, W. J., Buck, R. J., Sacks, J., and Wynn, H. P., "Screening, Predicting and Computer Experiments". *Technometrics*, Vol. 34, No. 1, 1992, pp. 15-25; and Morris, M. D., "Factorial Sampling Plans for Preliminary Computational Experiments". *Technometrics*, Vol. 33, No. 2, 1991, pp. 161-174 attempt to reduce the number of variables in a problem and therefore make it easier to find an optimum. Such techniques can require a significant fraction of the overall budget set aside for an optimization and offer no guarantee that a number of the original variables will be identified as being significantly important. The performance of these existing techniques can therefore be extremely problem dependant and can result in a poor reduced set of variables if all of the variables have broadly the same impact on a problem. As these traditional variable reduction techniques are restricted to the original variables, the reduced set can also result in a significant reduction of geometric flexibility.

An optimisation methodology using proper orthogonal decomposition to reduce the design space is described in Kamali, M., Ponnambalam, K., and Soulis, E. D., *Integration of Surrogate Optimization and PCA for Calibration of Hydrologic Models, A WATCLASS Case Study*, in *IEEE International Conference on Systems, Man and Cybernetics*. 2007, IEEE: Montreal, QC, Canada. p. 2733-2737. However, the process of Kamali et al. is not suitable for designing a physical structure such as an airfoil section.

SUMMARY OF THE INVENTION

A first aspect of the present invention provides a method of designing a structure, the method comprising:
a. generating a first set of candidate designs in a first optimisation process, each candidate design comprising a set of M design variables associated with an M-dimensional design space;
b. selecting a subset of the first set of candidate designs;
c. using the selected subset of candidate designs to define an N-dimensional design space defined by N design variables, N being less than M; and
d. generating a second set of one or more candidate designs in a second optimisation process, each candidate design comprising a set of N design variables associated with the N-dimensional design space.

The process can be applied to any optimization problem involving the search for an optimum geometry, for example, the process could have aerodynamic, structural or computational electromagnetic design applications.

The process could be applied to multi-disciplinary optimisation problems.

Preferably step c. comprises processing the selected subset of candidate designs by proper orthogonal decomposition or principal component analysis.

The first optimization process may include generating a response surface from the first set of candidate designs, and the second optimization process may include generating a response surface from the second set of candidate designs. A traditional Kriging-based surrogate modelling strategy could be employed, or any other surrogate modelling strategy could be employed in either the first or second optimization. Models utilising gradient or curvature information as well as employing variable fidelity simulations through co-Kriging could also be used.

Although a surrogate model is typically used in the secondary optimization, any other optimization could be employed at this stage. Quasi-Newton and other gradient descent methods could be used as could other global optimisers such as genetic algorithms.

The optimization process can be applied to both 2D and 3D geometries.

The reparameterisation process could also be repeated resulting in a series of optimizations with a steady reduction in the number of variables.

Although presented for a single objective optimization, the technique could also be applied to multiobjective optimization problems.

The process could also be applied to constrained optimization problems.

The candidate designs may be candidate geometries. However in the case of an airfoil structure, the candidate designs may instead define a pressure distribution rather than a geometry, and the pressure distribution could be converted to an airfoil geometry at the end of the process.

A second aspect of the invention provides a method of manufacturing a structure comprising designing the structure by the method of the first aspect of the invention, and manufacturing the structure in accordance with one of the candidate geometries.

BRIEF DESCRIPTION OF THE DRAWINGS

Embodiments of the invention will now be described with reference to the accompanying drawings, in which.

DETAILED DESCRIPTION OF EMBODIMENT(S)

Figure 1:
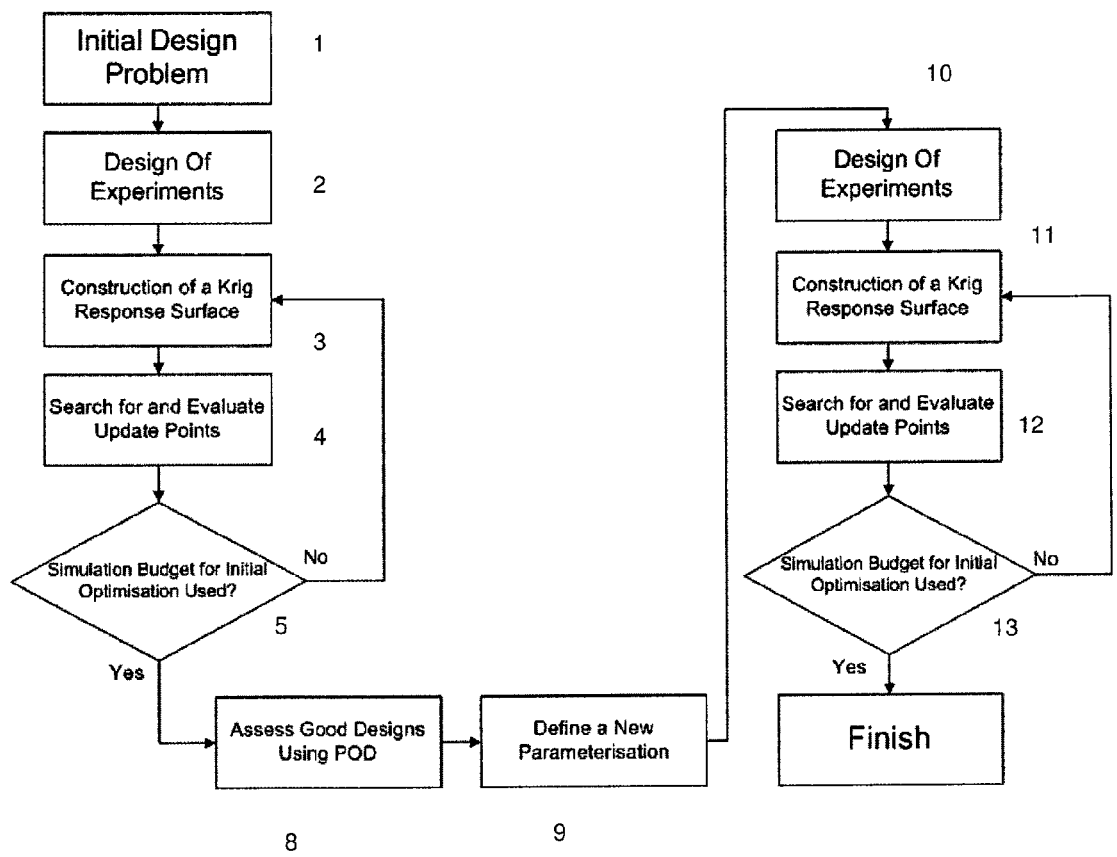
FIG. 1 is a flow diagram describing a method of designing a structure.

FIG. 1 is a flow diagram describing a method of designing a physical structure. FIG. 1 contains generic terms, but will be described with reference to a specific example: the design of an airfoil section.

The method can be split into three main stages:

An initial surrogate model optimization using a fraction of the total simulation budget is carried out on an original design problem (see steps 1-5 of FIG. 1 which will be described in further detail below)

A number of the best geometries found over the course of this optimization are then analysed using proper orthogonal decomposition to determine the important common geometric features (see step 8 of FIG. 1 which will be described in further detail below).

The result of this analysis is a series of basis functions which can fully recreate the airfoils used in the analysis. These functions then form a completely new geometry parameterization, which is the subject of a second surrogate model optimization using the remainder of the simulation budget (see steps 10-13 of FIG. 1 which will be described in further detail below).

Given an optimization problem with a limited simulation budget and an initial geometry parameterization the method of FIG. 1 begins with an initial surrogate model based optimization in steps 1-5.

Figure 2:
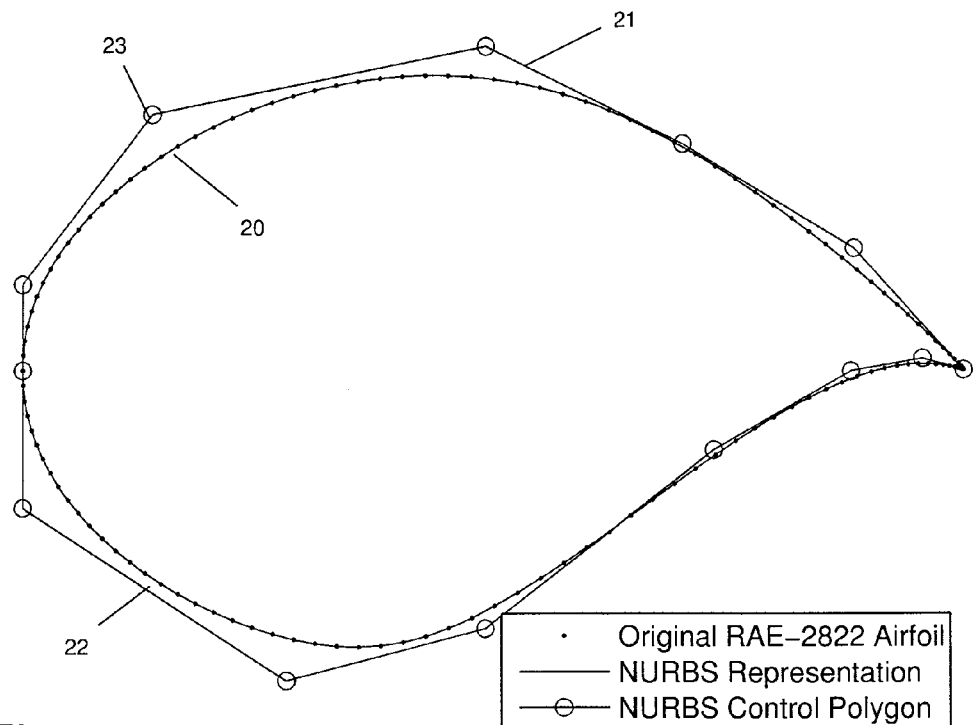
FIG. 2 shows a parameterization of a known airfoil.

In step 1 an initial design problem is defined. This involves defining a set of design variables associated with a first design space, and a specific example is given in FIG. 2. FIG. 2 shows a known airfoil 20 (the RAE-2822) which is parameterised in step 1 using two non-uniform rational B-spline (NURBS) curves, one NURBS curve 21 representing the upper surface and one NURBS curve 22 representing the lower surface. Control points, denoted by the circles 23 in FIG. 2 can move in both coordinate directions resulting in a total of twenty variables. The NURBS design space is described in further detail in Appendix A below. Although the weights of each control point remain fixed in this example they could be permitted to vary, increasing the design space to thirty-one variables.

Also as part of step 1 the nature of the design problem is determined, including:

an objective—in this case the objective is to minimize the drag to lift ratio (or maximise the lift to drag ratio)

various fixed parameters associated with the problem—in this case the process is seeking to minimize the drag to lift ratio at Mach 0.725, a Reynolds number of $6 \times 10^6$ and an angle of attack of $2°$ constraints—such as a maximum allowable weight bounds on the design variables—for instance minimum and maximum values for the X and Y co-ordinates of the control points 23

Next, in step 2 the design variables (in this example the twenty design variables defining the co-ordinates of the control points 23) are perturbed to generate a first set of candidate geometries for the airfoil. This step is illustrated schematically in FIG. 3 which shows two of the twenty design variables $x1$ and $x2$. A square grid is shown with each intersection between a horizontal and vertical grid line representing one of the candidate geometries which are generated in step 2.

Figure 3:
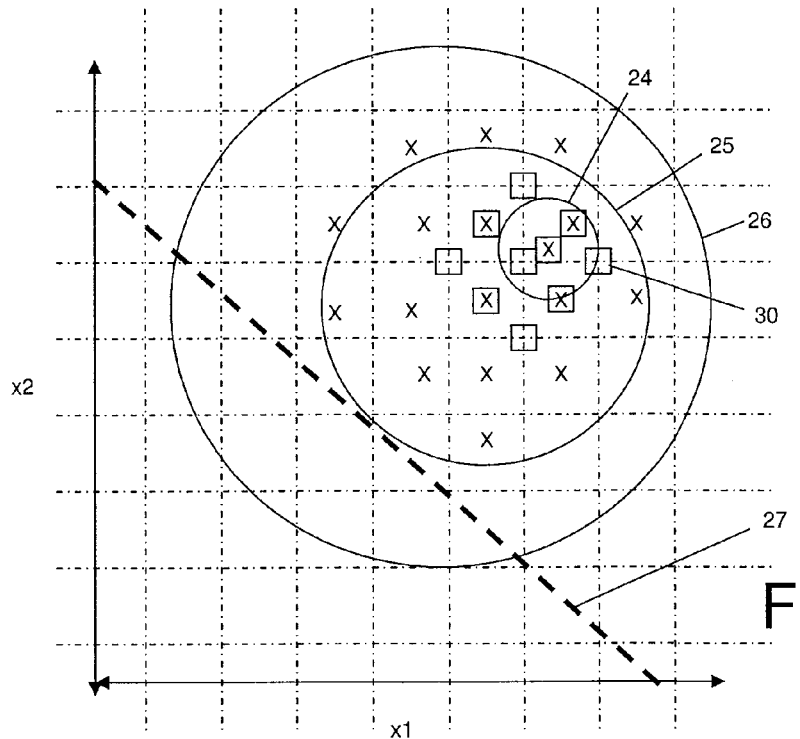
FIG. 3 is a schematic view of a two-dimensional design space.

In step 3 a Kriging response surface is constructed. This Kriging response surface is also known as a "surrogate model" and in the context of FIG. 3 it can be visualised as a continuous surface, with the height of the surface showing how the objective varies within the design space for $x1$ and $x2$. FIG. 3 shows three lines 24-26 each showing a contour (similar to a contour line on a map) of constant objective (in this case constant drag to lift ratio) within the Kriging response surface. Dashed line 27 in FIG. 3 gives an example of a lower bound on the design variables $x1$ and $x2$.

For further details on the construction of a Kriging response surface see for example:

Jones, D. R., "A Taxonomy of Global Optimization Methods Based on Response Surfaces". *Journal of Global Optimization*, Vol. 21, No. 4, 2001, pp. 345-383; and Sacks, J., Welch, W. J., Mitchell, T. J., and Wynn, H. P., "Design and Analysis of Computer Experiments". *Statistical Science*, Vol. 4, No. 4, 1989, pp. 409-435.

Although a Kriging based optimization is presented in FIG. 1, any other response surface could be constructed in step 3.

In step 4, the algorithm searches for and evaluates update points. Specifically, a computer simulation evaluates the true objective function for each of the geometries within the candidate geometries determined in step 2. The true objective function is then used to update the Kriging response surface which can be searched again using a stochastic method. Referring to FIG. 3, if step 3 calculates the drag to lift ratio for each intersection between a horizontal and vertical grid line, then step 4 might calculate the drag to lift ratio for the points indicated by an X in FIG. 3 which are clustered close to the high point of the objective function. Figure Each calculation of a lift to drag ratio involves a simulation of a candidate geometry, which is a computationally expensive process. Thus, there is a simulation budget depending on the computing power available. In step 5 an assessment is made of whether a simulation budget for the initial optimisation has been used. If not, then further iterations of steps 3 and 4 are performed. Otherwise the process moves on to step 8. Note that step 3 (construction of the response surface) is repeated in each iteration because the design variables have been redefined in step 4 and therefore the design space has a new shape.

Thus the initial optimization uses a proportion of the total available simulation budget. The simulation budget for the initial optimization is further divided between the design of experiments (step 2) and updates to the model (step 4).

Upon completion of the initial optimization, the geometries generated over the course of the optimization are analysed in step 8. A predefined number of the best geometries, based on the geometry's objective function value, are selected. The best geometries can be selected, or the geometries from the best clusters of design points can be selected using a KMEANS clustering algorithm. Selection using a clustering algorithm aims to preserve as great a degree of variation as possible between the geometries selected. Thus for example with reference to FIG. 3, step 8 may select the ten airfoil geometries represented by the squares 30.

The coordinates of each geometry in the selected subset is then used to construct a snapshot vector as per Sirovich's method of snapshots, described in: Sirovich, L., "Turbulence and Dynamics of Coherent Structures Part 1: Coherent Structures". *Quarterly of Applied Mathematics*, Vol. 45, No. 3, 1987, pp. 561-571. Both the x, y and z coordinates can be included in each snapshot depending on the problem. The location of control points of the original parameterization could also be included—in this example the control points 23 for the known airfoil 20 (the RAE-2822) as shown in FIG. 2.

The ensemble of snapshot vectors is then decomposed in step 8 using Proper Orthogonal Decomposition (POD)—also known as Principle Component Analysis or Karhunen-Loeve expansion—into a series of basis functions and corresponding coefficients. Each of these modes has an associated cumulative percentage variation indicating its importance with respect to the recreation of the initial geometries. A proportion of these basis functions are then selected based on either the cumulative percentage variation or on a predefined desired number of basis functions. Further details on the POD process are set out below in Appendix B.

The selected basis functions then form a new geometry parameterization which is defined in step 9 with the coefficients of these basis functions as the variables of the secondary optimization. Note that the POD process reduces the M-dimensional NURBS design space (where in this example M=20) into an N-dimensional design space defined by N design variables, N being less than M (in this example N=10).

A secondary optimization is then performed in steps 10-13. Steps 10-13 are essentially the same as steps 2-4 but instead of using the M design variables associated with the NURBS design space of FIG. 2, they use the N design variables associated with the new lower dimensional design space defined in step 9.

Although the secondary optimization of FIG. 1 uses a Kriging based response surface, it can utilise any optimization strategy, i.e. it is not restricted to a response surface model. The remainder of the simulation budget is then used in steps 10-13.

If a response surface process is used in the secondary optimization, and the number of basis functions is sufficiently high it may be assumed that the original geometries used to derive the basis functions can be completely recreated by the new parameterization. These geometries are therefore present in the new design space and since the objective function is already known they may be added to the design of experiments of the secondary optimization (step 10) without the cost of any additional simulations.

It is presently thought that the optimization strategy is most effective using a Kriging response surface optimization for both the initial and secondary optimizations (as shown in FIG. 1), with a KMEANS clustering algorithm to select the geometries used to generate the basis functions.

Figure 4:
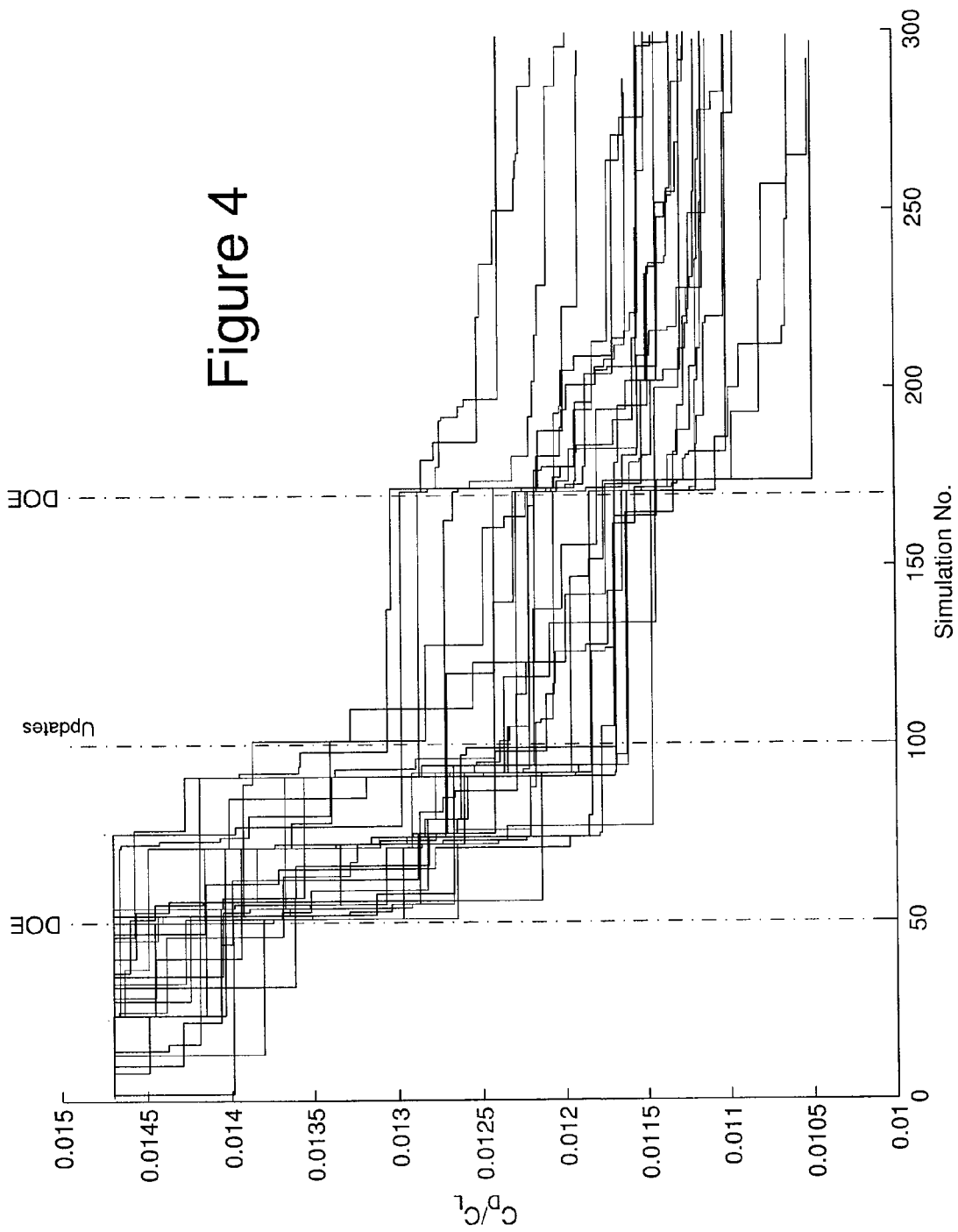
FIG. 4 shows the histories of twenty five optimizations, each following the method of FIG. 1.

FIG. 4 is a graph illustrating how a budget of 300 simulations can be expended by the method of FIG. 1. Specifically, FIG. 4 shows how the objective (drag to lift ratio) decreases over the course of the 300 simulations for twenty five different optimizations (each one of the twenty five optimizations being indicated by a respective line in FIG. 4). As shown in FIG. 4, the first fifty simulations are expended by the DOE step 2, the next fifty are expended by the repeated iterations of update step 4, the next seventy are expended by the DOE step 10, and the last one hundred and thirty are expended by the repeated iterations of update step 12.

Figure 5:
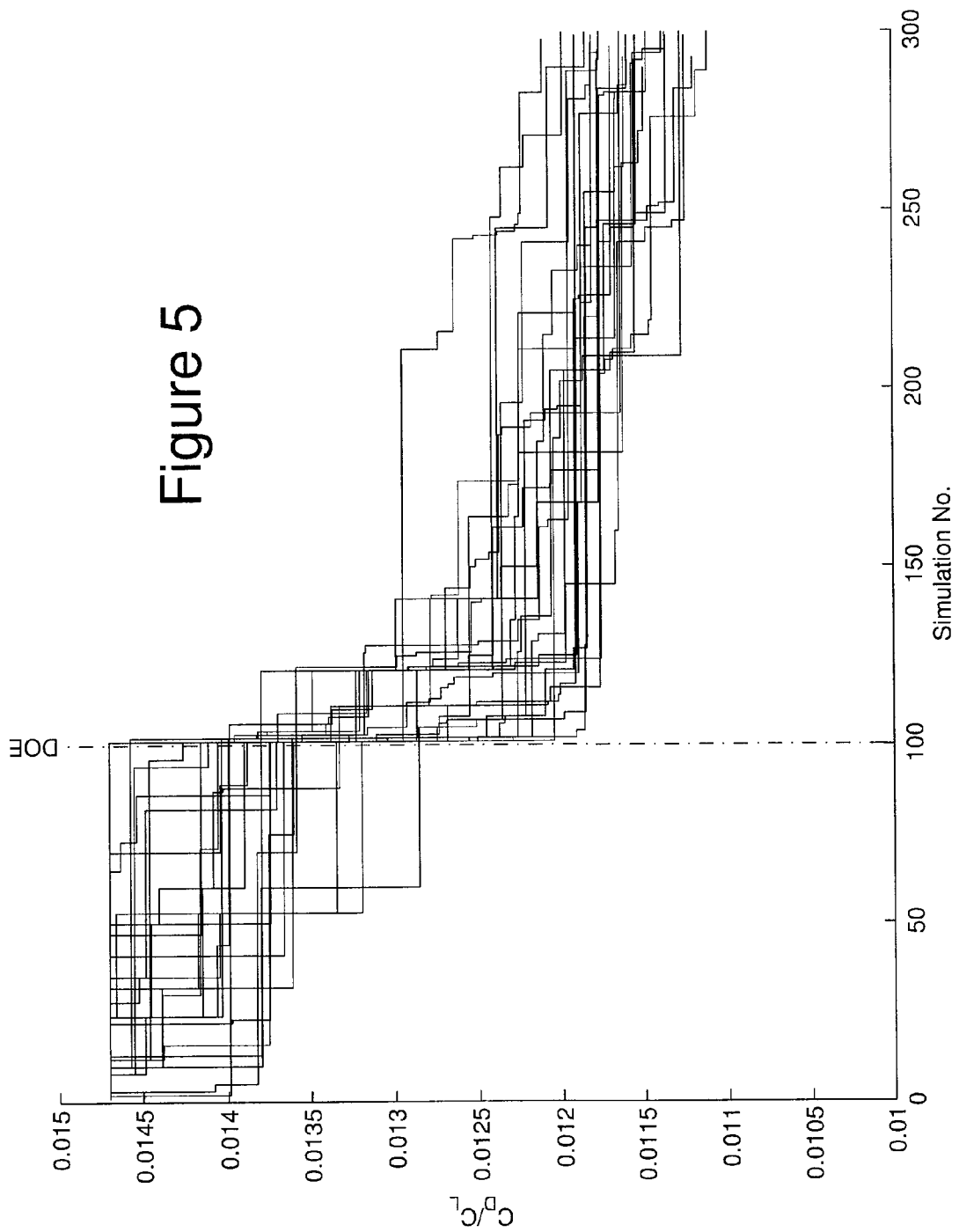
FIG. 5 shows the histories of twenty five optimizations using a traditional Kriging based surrogate modelling strategy.

By contrast, optimizing the airfoil using a traditional Kriging based surrogate modelling strategy with a limit of 300 simulations results in the optimization history shown in FIG. 5. Twenty five separate optimizations are performed leading to an average drag to lift ratio of 0.0116 (lift to drag ratio of 86.24). Each optimization, including the simulations and the construction of the Kriging model, takes an average of 22 hours to complete.

The twenty five optimizations shown in FIG. 4 produce an average drag to lift ratio of 0.0113 (lift to drag ratio of 88.35) an improvement on that achieved using the traditional strategy shown in FIG. 5. Not only did the quality of the average design improve but each optimization took an average of 6.6 hours to complete. In this optimization a total of twenty airfoils found during the initial optimization are used to derive the parameterization for the secondary optimization.

Figure 6:
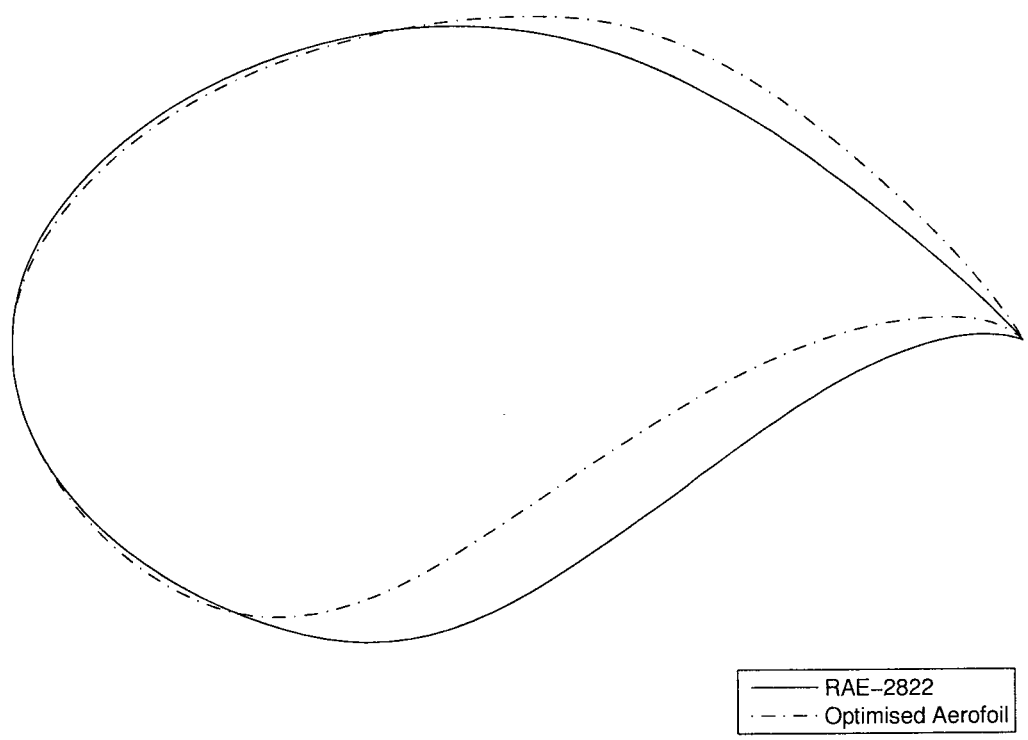
FIG. 6 compares the RAE-2822 airfoil with an airfoil optimised using the method of FIG. 1.

The advantages of this new optimization methodology over a traditional optimization utilising a variable reduction approach can be demonstrated by considering an airfoil resulting from the geometric filtration optimization process. FIG. 6 compares an optimized airfoil to the original RAE-2822. The geometric filtration methodology has resulted in significant modifications to the original RAE-2822 airfoil. Comparing this optimised airfoil to the parameterization shown in FIG. 2 one can observe that in order for the original parameterization to produce this optimised geometry a significant number of the control points have to be adjusted. A traditional variable screening technique will remove the ability of the optimization to adjust a number of these control points. Therefore a traditional variable screening technique will result in a parameterization with significantly less flexibility than that resulting from the geometric filtration process and will result in a poorer performing final design.

In summary, the new optimization strategy described above with reference to the accompanying drawings overcomes a number of problems associated with optimizations which employ a traditional variable screening approach:

Traditional variable screening can use a significant proportion of an available simulation budget in order to attempt to determine a subset of the most important variables. The actual optimization does not begin until this screening process is completed. The new optimization strategy presented can use the whole simulation budget available in the optimization of the design. The number of variables is therefore reduced as the optimization progresses and not before it begins.

Focusing on the subset of candidate designs from the first optimization process instead of the variables, helps to avoid the detrimental affect a poorly chosen geometry parameterization may have on a traditional variable reduction strategy. For example, a combination of the original variables which result in a large important change to the whole geometry can be captured by a small number of variables in the lower-dimensional design space, whereas traditional variable reduction would indicate all of the original variables are equally important.

The reparameterization procedure of step c. results in a greater degree of flexibility in terms of the designs that can be generated. For example, if a large global change to the design is required involving all of the variables in the original parameterization, a reduced set of these variables, as would result from a traditional variable reduction process, would not be able to modify the design to the same degree. Using the reparameterisation process of step c., important global geometry changes can be maintained.

As a number of the results of simulations from the initial optimization are irrelevant upon reparameterisation the cost of generating or tuning a surrogate model is reduced. For example, the cost of tuning a Kriging-based surrogate model depends greatly on the number of design points. The reduction in the number of points through the reparameterisation process therefore makes this process much cheaper.

Although the invention has been described above with reference to one or more preferred embodiments, it will be appreciated that various changes or modifications may be made without departing from the scope of the invention as defined in the appended claims.

APPENDIX A

This appendix describes a hierarchical method for 3-D NURBS generation for use in the method described above.

Starting with just a 4 pole Bezier aerofoil, a 3-D NURBS wing representation is developed. The hierarchical form of the representation could be important in that different optimisation methods may be used at the low fidelity level compared to the high fidelity level. Additionally, multi-level optimisation is facilitated.

Bézier Aerofoil Representation

Previous work [Holden, C. M. E. and Wright, W. A. "Optimisation Methods for Wing Section Design." Proceedings of the 38th Aerospace Sciences Meeting and Exhibit, Reno, Nev., January 2000, AIAA 2000-0842] has shown that a Bézier curve gives a parametric (in x and y) 2D representation in which geometrical and pressure distribution properties can be matched to an existing aerofoil. This representation then facilitates the modification of the section by movement of the Bézier x and y poles. The Bézier representation has the property that the pole locations follow the section curvature.

The equations for the Bézier curve are given by:

$$x(t) = \sum_{i=0}^{n} Bx_i \frac{n!}{i!(n-i)!} t^i (1-t)^{(n-i)} \quad [1]$$

$$y(t) = \sum_{i=0}^{n} By_i \frac{n!}{i!(n-i)!} t^i (1-t)^{(n-i)} \quad [1]$$

Where:
x, y are the Cartesian coordinates of the section
n+1 is the number of Bézier defining polygon vertices or poles, and is the same for x and y.
$Bx_i, By_i$ are the Bézier poles
t is the parametric variable, and is the same for x and y.

A curve fit to an existing aerofoil for further design or optimisation using an aerodynamic objective and constraints is required since this aerofoil encapsulates previous optimisation or design work. The existing or starting aerofoil for the optimisation or design process is created as follows. The upper and lower surfaces are defined separately.
1. Specify 4 poles. One pole at the leading and trailing edges and 2 in between.
2. Optimise the curve fit, to match geometry, using a simplex method, by varying the pole locations.
3. Increase the order of the Bézier curve and hence the number of poles by one, using order increasing, and without modifying the curve. This can be done by applying the formula:

$$B_i = aB_{i-1} + (1-a)Bx_i$$

Where: $a = \frac{i-1}{n}$

4. For all poles in both the x and y cases, except the first and last poles, which remain unchanged.
5. Re-optimise the curve using a simplex method.
6. Again increase the order of the Bézier curve. Repeat steps 3 and 4 until the desired number of poles is achieved.

Experimentation with one curve around the complete section showed that in this case, the leading edge was difficult to define and hence scaling of the aerofoil chord would be required, which is clumsy.

The final aerofoil was acceptable if both its geometry and $C_p$ distribution matched the original aerofoil. Optimisation is easier to perform for a smaller set of design variables. Therefore the minimum number of poles giving an acceptable geometry and pressure distribution is chosen for use in aerodynamic optimisation.

NURBS Aerofoil Representation

The next step was to use a non-uniform rational B-spline (NURBS) curve definition as an alternative to the Bézier curve, in which the addition of weights and local control of groups of poles provide further flexibility. Additionally, the resulting poles are positioned closer to the surface, which is also expected to give better control. As the Bézier formulation can be derived from the NURBS representation, the NURBS form is effectively a generalised version of the Bézier curve. This step was in fact performed in two parts, firstly to convert the Bézier curve form to a B-spline form and check that the same results were achieved for both forms and then to convert the non-rational form to a rational form.

The equations of a parametric NURBS curve are:

$$x(t) = \frac{\sum_{i=1}^{n+1} h_i Bx_i N_{i,k}(t)}{\sum_{i=1}^{n+1} h_i N_{i,k}(t)} \quad [3]$$

$$y(t) = \frac{\sum_{i=1}^{n+1} h_i By_i N_{i,k}(t)}{\sum_{i=1}^{n+1} h_i N_{i,k}(t)} \quad [4]$$

Where: all parameters have the same definitions as in equation [1], but with:

$h_i$ being the NURBS weightings $t_{min} \leq t \leq t_{max}$ $2 \leq k \leq n+1$ k is the order (and k−1 the degree) of the NURBS The basis functions $N_{i,k}$ are given by the Cox-deBoor recursion formulas, specifically:

$$N_{i,1}(t) = \begin{cases} 1 & \text{if } x_i \leq t < x_{i+1} \\ 0 & \text{otherwise} \end{cases}$$

And $$N_{i,k}(t) = \frac{(t-x_i)N_{i,k-1}(t)}{x_{i+k-1} - x_i} + \frac{(x_{i+k} - t)N_{i+1,k-1}(t)}{x_{i+k} - x_{i+1}}$$

The $x_i$s are the elements of a knot vector, satisfying the relation: $x_i \leq x_{i+1}$. The convention 0/0=0 is adopted.

The NURBS curve can then be created in a similar way to the Bézier curve, but with a few minor modifications. The initial pole placing and optimisation takes place as before. However, the weights are also design variables in the problem. The same weights can be used for the x and y curves.

Instead of increasing the order of the curve, the NURBS analogy is knot insertion. Knot insertion is performed by using the Oslo algorithm for both the x and y curves and the numerator and denominator of the NURBS definition:

For the numerator:

$$C_j k_j = \sum_{i=1}^{n+1} h_i B_i \alpha_{i,j}^k$$

And for the denominator:

$$k_j = \sum_{i=1}^{n+1} h_i \alpha_{i,j}^k$$

$$1 \le i \le n+1$$

$$1 \le j \le m+1$$

Where:
i indexes poles at the old, lower number of knots,
j indexes poles at the new, higher number of knots.
$B_i$ are pole positions at the lower number of knots,
$C_j$ are pole positions at the higher number of knots.
$h_i$ is used for weights at the lower number of knots,
$k_j$ is used for weights at the higher number of knots.

$$\alpha_{i,j}^1 = \begin{cases} 1 & \text{if } x_i \le y_j < x_{i+1} \\ 0 & \text{otherwise} \end{cases}$$

$$\alpha_{i,j}^k(t) = \frac{(y_{j+k-1} - x_i)\alpha_{i,j}^{k-1}}{x_{i+k-1} - x_i} + \frac{(x_{i+k} - y_{j+k-1})\alpha_{i+1,j}^{k-1}(t)}{x_{i+k} - x_{i+1}}$$

Where the n+k+1 $x_i$ are the elements of the knot vector prior to knot insertion and the m+k+1 $y_j$ are the elements of the knot vector after knot insertion.

A NURBS representation of an aerofoil is shown in FIG. 2. Compared with a Bézier representation there are fewer poles in the NURBS definition, but with additional design variables: the weights.

Three Dimensional Wing Representation

These ideas extend readily to three dimensions. x(u, w), y(u, w) and z(u, w) can be represented by Q(u, w), in three dimensions. Q(u, w), for the Bezier formulation, can be written as:

$$Q(u, w) = \sum_{i=0}^{n} \sum_{j=0}^{m} D_{i,j} \frac{m!}{j!(m-j)!} w^j (1-w)^{m-j} \frac{n!}{i!(n-i)!} u^i (1-u)^{n-i}$$

Where:
u, w are the parametric variables of the surface,
m+1, n+1 are the numbers of Bézier poles in the u and w directions,
and the $D_{i,j}$ are the three dimensional Bézier poles.

$$\text{If: } B_i(w) = \sum_{j=1}^{m+1} D_{i,j} \frac{m!}{j!(m-j)!} w^j (1-w)^{m-j}$$

Then Q(u, w) can be rewritten as:

$$Q(u, w) = \sum_{i=0}^{n} B_i(w) \frac{n!}{i!(n-i)!} u^i (1-u)^{(n-i)}$$

Therefore, conversion from a series of two dimensional curve fits to three dimensions can be performed obtaining the $D_{i,j}$ from the $B_i$, by matrix inversion. Unfortunately non-rational forms suffer from lack of robustness when curve fitting by successive optimisations.

The NURBS analogy is then given by:

$$Q(u, w) = \frac{\sum_{i=1}^{n+1} \sum_{j=1}^{m+1} s_{i,j} D_{i,j} M_{j,l}(w) N_{i,k}(u)}{\sum_{i=1}^{n+1} \sum_{j=1}^{m+1} s_{i,j} M_{j,l}(w) N_{i,k}(u)}$$

where:
u, w are the parametric variables of the surface
$S_{i,j}$ are the three-dimensional NURBS weights (which are the same in x, y and z)
$D_{i,j}$ are the three-dimensional NURBS poles.

$$\text{If } \frac{(h_i B_i)(w)}{\sum_{i=1}^{n+1} h_i(w) N_{i,k}(u)} = \frac{\sum_{j=1}^{m+1} s_{i,j} D_{i,j} M_{j,l}(w)}{\sum_{i=1}^{n+1} \sum_{j=1}^{m+1} s_{i,j} M_{j,l}(w) N_{i,k}(u)}$$

$$\text{And } h_i(w) = \sum_{j=1}^{m+1} s_{i,j} M_{j,l}(w)$$

$$\text{Then: } Q(u, w) = \frac{\sum_{i=1}^{n+1} (h_i B_i)(w) N_{i,k}(u)}{\sum_{i=1}^{n+1} h_i(w) N_{i,k}(u)}$$

As for the Bézier case, conversion from a series of two dimensional NURBS curve fits to three dimensions can be performed obtaining the $S_{i,j}$ and the $D_{i,j}$ from the $h_i$ and $B_i$, by matrix inversion.

APPENDIX B

Proper orthogonal decomposition (POD), otherwise known as Principle Component Analysis, or Karhunen-Loève expansion has been extensively used throughout engineering with regard to computational fluid dynamics (CFD). It has been used in the derivation of reduced order models for the purposes of control[1] and has also been used as a flow analysis tool[2]. POD decomposes a series, or ensemble, of snapshots[3] of data into a set of optimal orthogonal basis functions of decreasing importance. The basis functions are optimal in the sense that no other basis functions will capture as much information in as few dimensions[4]. Applying POD, therefore, to an ensemble of aerofoils results in a series of orthogonal basis functions similar to those of Robinson et al[5], with the first two basis functions identifying changes in aerofoil thickness and camber as being particularly important.

The decomposition process, as per Sirovich's method of snapshots[3], begins with the definition of an ensemble of snapshot vectors, S. In the case of the geometric optimizations considered within this patent application, the snapshot ensemble is constructed from a series of M vectors defining the x and y coordinates of a subset of designs selected from the initial optimization, $$S=[s_1 s_2 \text{-} s_M].$$

In other words, each vector $s_i$ is a twenty-dimensional vector representing one of the subset of M candidate airfoil designs within the NURBS design space selected in step 8 of FIG. 1.

The matrix of snapshots is then decomposed into a mean, $\bar{s}$ and a matrix of the fluctuations of each snapshot from this mean, $$S=\bar{s}+F$$

where $$\bar{s} = \frac{1}{M}\sum_{i=1}^{M} s_i.$$

The orthogonal basis functions are then calculated by considering the solution to the following eigenvalue problem, $$CV=\Lambda V$$

where the square symmetric correlation matrix C is given by, $$C=F^T F.$$

The matrix of eigenvectors, V, can then be used to calculate the matrix of eigenfunctions, $$\Phi=FV.$$

where $\Phi$ is a matrix of M eigenfunctions. These eigenfunctions, along with the corresponding vector of modal coefficients, $\alpha$, or matrix of modal coefficients, A allow the fluctuations and hence the original snapshots to be reconstructed, $$s_i=\bar{s}+\Phi\alpha_i$$

or $$S=\bar{s}+\Phi A.$$

The advantage of POD is that not all of the M POD basis functions (eigenfunctions) are necessary to recreate the original snapshot ensemble to a required degree of accuracy. The cumulative percentage variation[6] can be used to define a reduced number of basis functions with which the original ensemble can be approximately recreated. The importance of each POD basis function is related to the relative magnitude of the corresponding eigenvalue, a large eigenvalue therefore indicates an important basis function. The cumulative percentage variation, $$\frac{\sum_{i=1}^{N}\lambda_i}{\sum_{i=1}^{M}\lambda_i} \times 100,$$

is therefore a measure of the combined importance of N basis functions. Using this simple parameter a reduced number of basis functions can be selected in order to meet a minimum required percentage variation. Using this reduced number of basis functions, the original snapshot vectors can be approximated by, $$s_i \approx \bar{s} + \sum_{i=1}^{N} \alpha_i \phi_i,$$

where $\phi_i$ and $\alpha_i$ are the N most important basis vectors and corresponding modal coefficients. The modal coefficients corresponding to each of the original snapshot vectors can be calculated quite easily using the orthonormality property of the basis vectors.

The geometric filtration optimization methodology therefore moves from a surrogate modelling optimization which considers the magnitude of the original design variables to one which considers the magnitude of the modal coefficients with the bounds of the secondary optimisation defined by the minimum and maximum modal coefficients of the original snapshot ensemble.

REFERENCES

1. Gross, A. and Fasel, H. F., "Control-Oriented Proper Orthogonal Decomposition Models for Unsteady Flows". *AIAA Journal*, Vol. 45, No. 4, 2007, pp. 814-827.
2. Kim, Y., Rockwell, D., and Liakopoulos, A., "Vortex Buffeting of Aircraft Tail: Interpretation via Proper Orthogonal Decomposition". *AIAA Journal*, Vol. 43, No. 3, 2005, pp. 550-559.
3. Sirovich, L., "Turbulence and Dynamics of Coherent Structures Part 1: Coherent Structures". *Quarterly of Applied Mathematics*, Vol. 45, No. 3, 1987, pp. 561-571.
4. Lucia, D. J. and Beran, S., "Reduced-Order Model Development Using Proper Orthogonal Decomposition and Volterra Theory". *AIAA Journal*, Vol. 42, No. 6, 2004, pp. 1181-1190.
5. Robinson, G. M. and Keane, A. J., "Concise Orthogonal Representation of Supercritical Aerofoils". *Journal of Aircraft*, Vol. 38, No. 3, 2001, pp. 580-583.
6. Jolliffe, I. T., *Springer Series in Statistics: Principle Component Analysis*. 2nd ed. 2002: Springer-Verlag New York Inc.

The invention claimed is:

1. A method of designing a structure, the method comprising:
    a. defining a set of M design variables associated with an M-dimensional design space, and perturbing the M design variables to generate a first set of candidate designs in a first optimization process using a computer, each candidate design comprising a perturbed set of M design variables associated with the M-dimensional design space, each candidate design having an objective function value;
    b. analyzing the first set of candidate designs and selecting a subset of the first set of candidate designs based on the candidate design's objective function value using a computer;
    c. using only the selected subset of candidate designs to define an N-dimensional design space defined by N design variables using a computer, N being less than M; and
    d. perturbing the N design variables to generate a second set of one or more candidate designs in a second optimization process using a computer, each candidate design comprising a perturbed set of N design variables associated with the N-dimensional design space.

2. The method of claim 1 wherein step c. comprises processing the selected subset of candidate designs by proper orthogonal decomposition or principal component analysis.

3. The method of claim 1 wherein the first optimization process comprises generating a response surface from the first set of candidate designs.

4. The method of claim 1 wherein the second optimization process comprises generating a response surface from the second set of candidate designs.

5. The method of claim 3 wherein the response surface is a Kriging response surface.

6. The method of claim 1 wherein the candidate designs are candidate geometries.

7. The method of claim 1 wherein the structure comprises an airfoil section.

8. The method of claim 7 wherein the candidate designs comprise non-uniform rational B-spline (NURBS) representations of an airfoil section.

9. The method of claim 1 wherein the subset of the first set of candidate designs is selected in step b. by a clustering algorithm.

10. A method of manufacturing a structure comprising designing the structure by the method of claim 1, and manufacturing the structure in accordance with one of said candidate designs.

* * * * *